FREQUENCY SYNTHESIS SYSTEM

Filed Nov. 2, 1954 2 Sheets-Sheet 1

INVENTOR.
FRANZ L. PUTZRATH
BY G. A. Rechif
AGENT

June 25, 1957 F. L. PUTZRATH 2,797,326

FREQUENCY SYNTHESIS SYSTEM

Filed Nov. 2, 1954 2 Sheets-Sheet 2

INVENTOR.
FRANZ L. PUTZRATH
BY F. A. Reckif
AGENT

United States Patent Office 2,797,326

Patented June 25, 1957

2,797,326

FREQUENCY SYNTHESIS SYSTEM

Franz L. Putzrath, Oaklyn, N. J., assignor to Radio Corporation of America, a corporation of Delaware Application November 2, 1954, Serial No. 466,287

The terminal fifteen years of the term of the patent to be granted has been disclaimed 6 Claims. (Cl. 250—36)

This invention relates to a frequency synthesis system, and more particularly to a system for generating any chosen frequency in the neighborhood of another frequency.

For many types of equipment, such as aircraft communications equipment, it is desirable to have a number of closely spaced, accurately controlled radio frequency carriers available. For various reasons, however, it is impossible or impracticable to have a crystal-controlled oscillator for each of the desired carrier frequencies, so that ordinarily a high frequency, highly accurate and stable oscillator output is mixed with the output of a relatively low frequency, free-running oscillator, to provide the synthesized radio frequency carrier. The resultant carrier is a relatively accurate desired radio frequency, although other undesired beat frequencies are also generated. These undesired frequencies generally interfere with the production of the desired frequency.

An object of this invention is to devise a novel type of frequency synthesis system.

Another object is to provide a frequency synthesis system in which any undesired beat frequencies which may be produced in the system are of such values that they are easily filtered out at the output of the system.

The objects of this invention are accomplished, briefly, in the following manner: The output of a highly stable oscillator is applied to a time delay network whose delay depends upon a controlling voltage or current applied thereto. By the application of a controlling voltage or current to this network such as to cause a sawtooth variation of the time delay provided thereby, the output frequency of the network is altered from its input frequency. By variation of the frequency of the said sawtooth time delay variation, the synthesized output frequency of the time delay network may be varied in the neighborhood of the stable oscillator frequency.

The foregoing and other objects of the invention will be better understood from the following description of an exemplification thereof, reference being had to the accompanying drawings, wherein.

Figure 1:
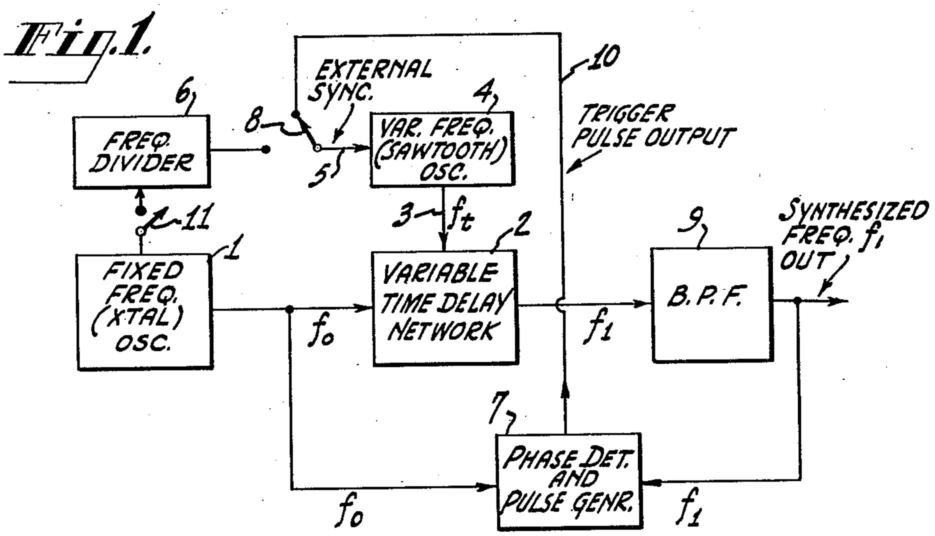
Fig. 1 is a block diagram of a frequency synthesis system according to the invention.

Referring to Fig. 1, a fixed-frequency crystal oscillator 1 having a highly stable output frequency $f_0$ feeds this output frequency into a variable time delay network 2. Network 2, which may for example be of a type described more fully hereinafter, provides a time delay which is a function of a controlling voltage or current applied thereto by means of a connection 3.

Of course, if the network 2 provides a constant time delay in signals passing therethrough, the output wave of this network would be of exactly the same frequency as the input wave thereto, the output wave being merely delayed in time (phase) with respect to the input wave. However, if a controlling voltage or current (for example, a voltage or current having a sawtooth waveform) is applied to connection 3 such as to cause a sawtooth function of time delay by network 2, the output wave of this network will have a frequency different from the input wave thereto, since in this case the continuously-varying time delay effected by network 2 results in a continuously-varying phase difference between the output and input waves, which is equivalent to a frequency difference between such waves. More specifically, $$f_1=f_0(1\pm\Delta t f_t) \quad (1)$$

where $f_1$ is the output frequency of network 2, $f_0$ is the input frequency of network 2 (output frequency of oscillator 1), $\Delta t$ is the change in time delay (maximum to minimum) provided by network 2, and $f_t$ is the frequency of the time delay function (the frequency of the controlling voltage or current applied to connection 3). In Equation 1, the minus sign is used when the sawtooth function of time delay jumps from a maximum to a minimum and varies more gradually from a minimum to a maximum, while the plus sign is used when the time delay function is inverted.

As may be seen from Equation 1, by applying a frequency $f_t$ as a controlling voltage or current to network 2 to continuously vary the time delay provided thereby, a frequency $f_1$ different from the input frequency $f_0$, but in the neighborhood thereof, may be provided at the output of said network. Also, by variation of the frequency $f_t$ of the controlling voltage, or by varying $\Delta t$ provided by the network, the output frequency $f_1$ may be varied.

The controlling voltage or current of frequency $f_t$ is supplied to network 2 from a variable frequency (for example, sawtooth) oscillator 4 the output of which is applied to connection 3. Oscillator 4, which will be described hereinafter in more detail, is capable of either astable (free-running) or synchronized operation, the synchronizing signal being applied to this oscillator by means of a connection 5 labelled "external sync." The synchronizing signal can be obtained from either a frequency divider 6 or a combined phase detector and pulse generator 7, the synchronizing signal selection being made by means of a switch 8 connected to lead 5 and movable to either one of two positions in one of which the output of divider 6 is coupled to lead 5 and in the other of which the output of unit 7 is coupled to lead 5. This switch is illustrated in the latter position.

If a controlling voltage or current of frequency $f_t$ is applied as disclosed to network 2 such as to produce a sawtooth function of time delay in this network, at certain intervals in this sawtooth waveform the sawtooth will change rapidly or suddenly from maximum to minimum, or vice versa, depending upon the direction of slope of the sawtooth. This means that at these intervals the time delay provided by network 2 will change rapidly from a maximum to a minimum, or vice versa, resulting in rapid periodic changes in the output frequency out of network 2. These periodic changes in the output frequency appear as periodic high frequency signal bursts in the output of network 2. These unwanted signal bursts are easily filtered out, however, by applying the output of network 2 to a bandpass filter 9 which passes the frequency $f_1$ (in the neighborhood of $f_0$) but greatly attenuates the undesired high frequency signal bursts.

In the system of this invention, no frequencies other than $f_0$, $f_1$ and $f_t$ are generated (with the exception of the high frequency bursts previously referred to), thus avoiding many of the difficulties encountered in other frequency synthesis systems due to the production of extraneous or undesired beat frequencies which are close to the desired frequency. As previously stated, the high frequency bursts are easily filtered out at the output of the system.

In order to avoid discontinuities in the wave of the synthesized frequency $f_1$ it is necessary to change from maximum to minimum delay (or vice versa) of network 2 at a time when $f_1$ and $f_0$ are "in phase," or it is necessary that $$\frac{f_0-f_1}{f_t}=n$$

where $n$ is any integer. In other words, it is necessary to insure that the waveform of the synthesized signal is not distorted, that is, the waveform of the synthesized signal should begin, in amplitude, at the point in time where the wave whould have been if it had not been interrupted by the high frequency bursts previously referred to.

The above condition (proper timing of the burst signal) may be sufficiently well approximated if $f_t$ is determined by an astable or free-running oscillator 4 (in which case the "external sync" connection 5 is broken inside said oscillator, in a manner to be explained), although an external synchronizing signal for this oscillator may be derived from either one of two alternative sources.

With switch 8 in the position illustrated, and with the "external sync" connection completed inside oscillator 4, the output of a phase detector and pulse generator 7 is used as a synchronizing signal for the (sawtooth) oscillator 4. A sample of the crystal oscillator output frequency $f_0$ and a sample of the synthesized frequency $f_1$ are applied to the phase detector 7. Whenever the two input signals are "in phase" a trigger pulse is produced in the output connection 10 of a pulse generator the input of which is coupled to the phase detector output. The trigger pulses in connection 10 are applied to connection 5 and operate to synchronize or trigger the sawtooth oscillator 4 when the two frequencies $f_0$ and $f_1$ are "in phase." This produces a substantially continuously-variable frequency $f_1$.

The other one of the two alternative sources of synchronizing signal is the crystal oscillator 1. A portion of the output of crystal oscillator 1 is applied to the input of the frequency divider 6 when a switch 11 is closed. With switch 8 in its other (unillustrated) position, the output of divider 6 is applied to the "external sync" connection 5 of oscillator 4. With switch 8 in its other position where it is connected to frequency divider 6 and with the "external sync" connection completed inside oscillator 4, the crystal-stabilized output of divider 6 is utilized to trigger or synchronize the sawtooth oscillator 4. In this way, the proper timing of the burst signal is assured and, at the same time, the stability of the fixed frequency oscillator 1 is imparted to the variable frequency oscillator 4.

Typical values for the various frequencies in the system will depend, of course, entirely upon the particular application thereof. However, a multichannel communications equipment operating near 4 mc. might employ the following values, referring to Equation 1: With $f_0$ of 4.00 mc. and a $\Delta_t$ of 0.25 microsecond, for an $f_t$ of 20 kc. one $f_1$ would be 4.02 mc., for an $f_t$ of 40 kc. a second $f_1$ would be 4.04 mc., and for an $f_t$ of 60 kc. a third $f_1$ would be 4.06 mc., etc. With the same value of $f_0$ and a $\Delta_t$ of 0.50 microsecond, for an $f_t$ of 10 kc. one $f_1$ would be 4.02 mc., for an $f_t$ of 20 kc. a second $f_1$ would be 4.04 mc., and for an $f_t$ of 30 kc. a third $f_1$ would be 4.06 mc., etc.

Figure 2:
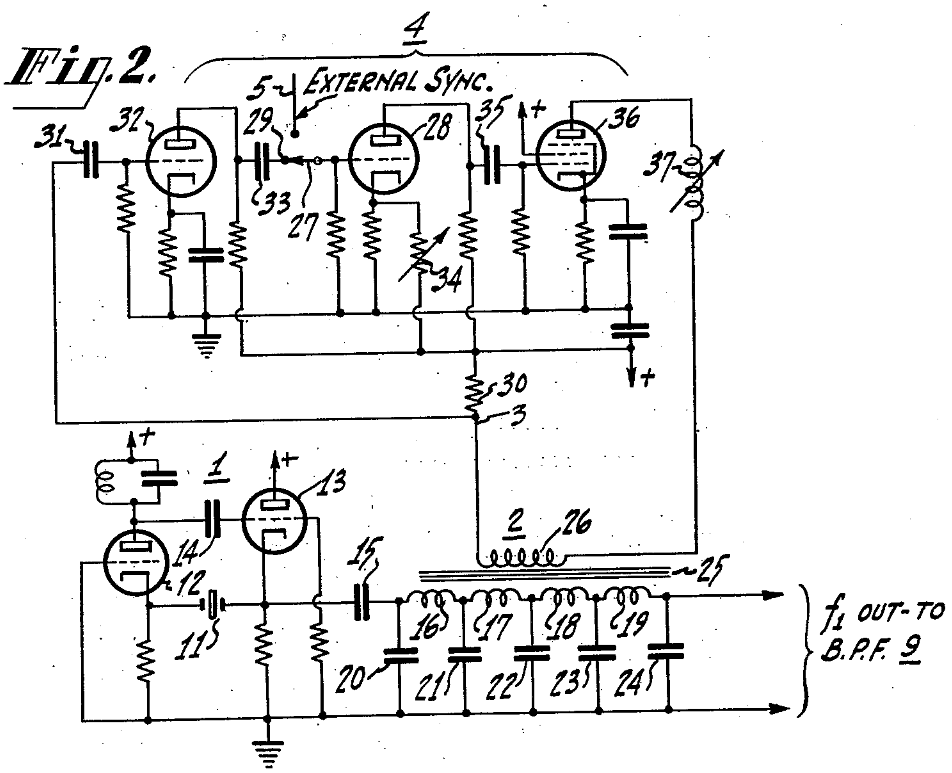
Fig. 2 is a detailed circuit schematic of a portion of Fig. 1.

Referring to Fig. 2, which is a detailed schematic of typical circuitry which could be used in the blocks 1, 2 and 4 of Fig. 1, the fixed frequency oscillator 1 may be a cathode-coupled crystal oscillator, which provides good stability and a low source impedance for the delay line 2. Thus, the piezoelectric crystal 11 is coupled between the cathodes of two evacuated triodes 12 and 13, while the anode of tube 12 is connected to the grid of tube 13 through a coupling capacitor 14. Oscillator 1 has an output frequency $f_0$ which is fed from the cathode of tube 13 through a coupling capacitor 15 to the input side of the variable time delay network 2.

The variable time delay network 2 may comprise a plurality of series-connected inductance elements 16, 17, 18 and 19 separated by shunt capacitance elements 20, 21, 22, 23 and 24, the input connections to this network being across capacitor 20 and the output connections being across capacitor 24. All of the inductance elements 16–19 are wound on a common ferromagnetic core 25 whose permeability can be varied by means of a saturating winding 26 mounted on such core, in a manner similar to a saturable reactor. By variation of the current flowing through winding 26, the permeability of the core 25 may be varied, thus also varying the inductance provided by elements 16–19. Since the time delay provided by the inductance-capacitance network 2 is a function of its inductance and capacitance, a suitably varying saturating current flowing through saturating winding 26 will result in a different frequency $f_1$ (different from the input frequency $f_0$) at the output of network 2, which output frequency is applied to the input of the bandpass filter 9. The network 2 is illustrated as being of the lumped constant variety.

The variable frequency oscillator 4 of Fig. 2 is arranged to produce a sawtooth of current in the winding 26, which winding provides an inductive load for the oscillator. This sawtooth oscillator can be astably operated (free running) or operated from an external synchronizing pulse, depending upon the position of a switch 27 in oscillator 4 which in accordance with its position connects the grid of a tube 28 either to the "external sync" lead 5 or to a terminal 29. This switch is illustrated in its "free running" position, on terminal 29. In this astable or free running case, current through the load (saturating winding 26) is monitored by a resistor 30 which is coupled at one end to the positive unidirection potential source and at its other end to one end of winding 26 by means of lead 3. This monitored sawtooth signal is applied through a coupling capacitor 31 to the grid of a tube 32 for amplification therein. The sawtooth signal is amplified in vacuum tube 32 and applied through a coupling capacitor 33, terminal 29 and switch 27 to the grid of a tube 28 which operates as a clipper. A clipping level adjustment is provided by making the resistor 34 which is connected between the cathode of tube 28 and the positive unidirectional potential source, adjustable. A series of pulses then appears at the anode of tube 28 and these pulses are coupled through a capacitor 35 to the grid of a pentode tube 36 operating as a driver. Rectangular pulses having very short rise and fall times, and having rather short duration, are produced at the anode of tube 36 and these are applied to the inductive load comprising an auxiliary variable inductor 37 and the load inductor (saturating winding) 26. These short pulses, applied to the inductive load 26, produce a sawtooth waveform of current in such load.

It will be noted that the foregoing description assumes that there is a sawtooth-shaped current waveform through the load 26, which is monitored by resistor 30 and used for producing succeeding pulses to recreate the sawtooth wave in the load. It will now be explained how the circuit is initially set into operation. Assume that the circuit is at rest and suddenly the positive unidirectional anode voltage is applied to tubes 32, 28 and 36. Tubes 32 and 28 will be in the proper operating range very rapidly. However, the following transient will occur in tube 36. The anode voltage of this tube will rise quickly to the full B+ potential, as the inductive anode load 37, 26 cannot pass current instantaneously, yet the steady state current through this load will be of some finite value. Thus, as the load current changes from zero toward its final value, a voltage is impressed across resistor 30, which then is treated in the manner described in the preceding paragraph. The first few cycles of oscillation of the sawtooth oscillator 4 might, of course, be of a different amplitude and frequency from the final (sawtooth) wave.

When switch 27 is in its other position, synchronizing pulses on lead 5 (derived from either unit 6 or unit 7, depending upon the position of switch 8) are applied directly to the grid of tube 28, and the oscillator operates in the same way to produce a sawtooth waveform of current in the inductive load 26.

The sawtooth current wave of frequency $f_t$ thus developed in saturating winding 26 causes the time delay provided by network 2 to vary in similar sawtooth fashion, as desired to produce the synthesized output frequency $f_1$ from the input frequency $f_0$ to this network.

As previously stated, it is desired that the time delay provided by network 2 be made to vary in sawtooth fashion. One possibility for assuring that this time delay is a sawtooth function might be based on the fact that if $f_0$ and $f_1$ are modulated or mixed together, the resultant signal will be a sinusoid. Any deviation therefrom could then be used as a corrective signal for the delay controlling voltage $f_t$. In general, however, it would be desirable to obtain sufficient time-delay linearity without having to resort to such involved feedback schemes.

The lumped constant delay line illustrated at Fig. 2 is in essence provided with a single reactor, since all of the inductance elements 16–19 are wound on a single, common core 25. Such a reactor must be specially designed, to obtain the desired amounts of mutual coupling between coils. However, if the lumped constant delay line were made out of individual inductors, it would be possible to use any saturable reactors capable of working in the desired frequency range.

In addition to the variable time delay network disclosed in Fig. 2 (which network is based on the variation of inductance by saturation of a core), other forms of networks are possible. For example, the time delay network could be based on the variation of capacitance by variation of the bias voltage on nonlinear capacitors, as illustrated for example in the copending but now abandoned Wheeler application, Serial No. 278,859, filed March 27, 1952.

For either astable or synchronized operation of the oscillator 4, the rate of change of current in the load 26 depends upon the value of inductance 37, this rate of charge varying inversely as the value to which inductance 37 is adjusted. Thus, the rate of change of current in the load 26 may be adjusted by inductor 37. Since for the illustrated position of switch 27 a given current level in the load triggers the oscillator, the series inductor 37 becomes the frequency control, by means of which the frequency $f_t$ of the sawtooth wave may be varied. Also, from Equation 1, it may be seen that the output or synthesized frequency $f_1$ depends upon the frequency $f_t$ of the controlling voltage. Thus, by varying the frequency $f_t$ (by variation of inductor 37) the output frequency $f_1$ is correspondingly varied, so that the series inductor 37 is the frequency control for the output (synthesized) frequency $f_1$.

By varying the bias on tube 36 the amplitude of the current through winding 26 can be varied, thus controlling $\Delta t$, the change in time delay provided by network 2. From Equation 1, it may be seen that this will also vary the output frequency $f_1$.

Figure 3:
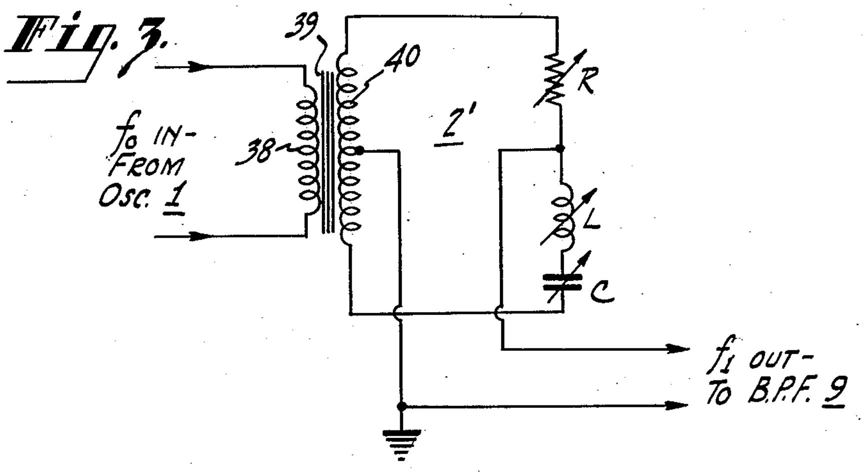
Fig. 3 is a schematic diagram of another type of delay network which may be used in the system of Fig. 1.

The variable time delay network 2, instead of being of the type disclosed in Fig. 2, may be of the type illustrated at 2′ in Fig. 3, to which latter figure reference will now be made. In Fig. 3, the input frequency $f_0$ from oscillator 1 is applied to the primary winding 38 of an input transformer 39 the secondary winding 40 of which is connected across a series-connected resistance-inductance-capacitance network RLC. One output connection for the bandpass filter 9 is taken from the common junction of R and L, while the other connection is taken from the midpoint of winding 40, which is also grounded.

In Fig. 3, the inductance L may be varied by the use of a saturable reactor for this inductance, the sawtooth controlling voltage or current of frequency $f_t$ being fed to the saturating winding of such reactor to vary the inductance provided thereby. Alternatively, the capacitance C may be varied by the use of a reactance tube for this capacitance, the sawtooth controlling voltage or current of frequency $f_t$ being fed to the control electrode of this reactance tube to vary its effective capacitance. Alternatively, the resistance R can be made variable in any suitable manner, to be varied by $f_t$.

In either case, the continuously-varying time delay thus provided by network 2′ causes the frequency $f_1$ (different from the input frequency $f_0$ but in the neighborhood thereof) to be produced at the output terminals of said network. In Fig. 3, to obtain a frequency difference (between $f_1$ and $f_0$) of one complete cycle it would be necessary to vary the resonant frequency of L and/or C from below to above $f_0$. This can be accomplished by the use of a saturable reactor or reactance tube, as previously described.

Figure 4:
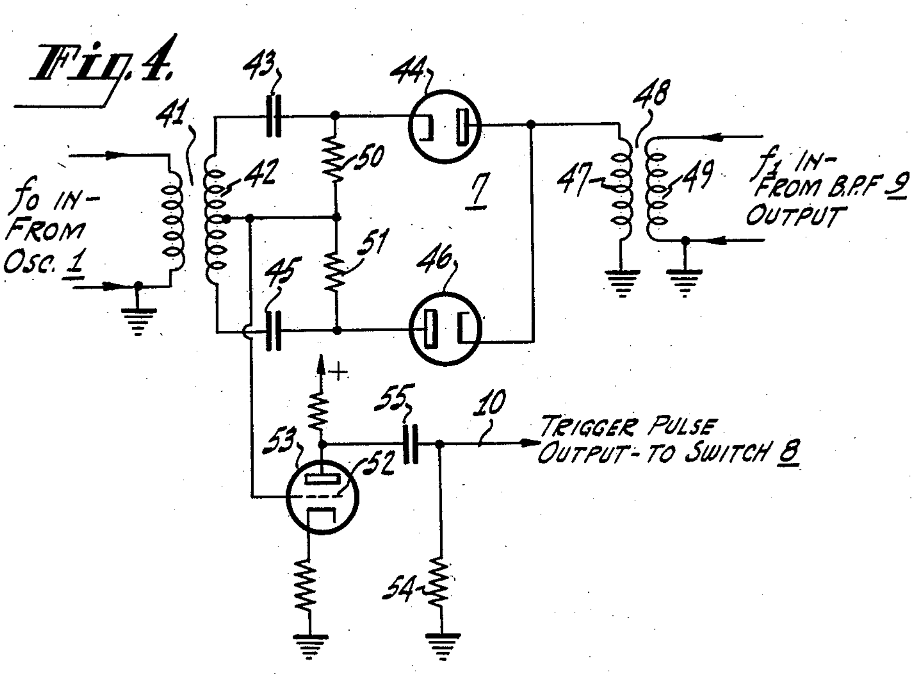
Fig. 4 is a detailed circuit schematic of a portion of Fig. 1.

Fig. 4, to which reference will now be made, illustrates a phase detector and pulse generator which can for example be used at 7 in Fig. 1, for proper external synchronization of the variable frequency sawtooth oscillator 4. The frequency $f_0$ from crystal oscillator 1 is applied across the primary winding of a transformer 41, one end of this primary winding being grounded as illustrated. One end of the secondary winding 42 of transformer 41 is coupled through a capacitor 43 to the cathode of a diode 44, while the other end of winding 42 is coupled through a capacitor 45 to the anode of a diode 46. In this way, the stable input frequency $f_0$ is supplied to both diodes 44 and 46. The anode of diode 44 and the cathode of diode 46 are connected together and to one end of the secondary winding 47 of a transformer 48, the other end of winding 47 being grounded. The synthesized output frequency $f_1$, appearing at the output of bandpass filter 9, is sampled and applied across the primary winding 49 of transformer 48, one end of winding 49 being grounded as illustrated. Thus, the synthesized output frequency $f_1$ is also supplied to both diodes 44 and 46. A pair of resistors 50 and 51 are connected in series between the cathode of diode 44 and the anode of diode 46, the common junction between these resistors being connected to the midpoint of winding 42.

The phase detector described is quite similar to that used in a certain color television receiver. It is a "balanced" phase detector, rather similar to that disclosed in Patent No. 2,460,112. The phase detector output is taken between the midpoint of winding 42 and ground, and this output voltage is applied to the grid 52 of a triode vacuum tube 53 which forms part of the pulse generator. A voltage that is of substantially trapezoidal waveform appears at the anode of tube 53, and this voltage is differentiated by means of a network including a resistor 54 and a capacitor 55, to form short pulses which appear in the output lead 10 coupled to the upper ungrounded end of resistor 54. Whenever the two signals ($f_0$ from crystal oscillator 1 and $f_1$, the synthesized output frequency) are in phase, a trigger pulse appears in output lead 10 and this is applied to the variable frequency sawtooth oscillator 4 (if switches 8 and 27 are in the proper positions) to trigger the same, in the manner above described, in such a way as to avoid discontinuities in the wave of the synthesized output frequency $f_1$. The output of the phase detector described is zero if $f_0$ and $f_1$ are at 90° relative phase. However, a corrective phase shift can easily be effected by feeding the primary of transformer 41 from a pentode or other constant current device.

What is claimed is:

1. In a frequency synthesizer, a stable frequency source of oscillatory energy, a variable time delay network coupled to the output of said source, the time delay provided by said network being capable of variation in response to a controlling voltage applied thereto, a variable frequency oscillator having an output of periodic sawtooth waveform, said oscillator being constructed and arranged to be operated either astably or synchronized to an external signal, a phase detector for comparing the outputs of said source and of said network, means for applying the output of said phase detector to said oscillator as an external synchronizing signal therefor, and means applying the output of said oscillator as a controlling voltage to said network, to thereby produce a network output wave having a frequency different from the frequency of said source.

2. In a frequency synthesizer, a stable frequency source of oscillatory energy, a variable time delay network coupled to the output of said source, the time delay provided by said network being capable of variation in response to a controlling voltage applied thereto, an oscillator having an output voltage of periodic sawtooth waveform, means applying said sawtooth output voltage to said network as a controlling voltage therefor, means for deriving from said source a stable frequency wave, means for applying said derived stable frequency wave to said oscillator as an external synchronizing signal therefor, and means for utilizing the output of said network.

3. In a frequency synthesizer, a stable frequency source of oscillatory energy, a variable time delay network coupled to the output of said source, the time delay provided by said network being capable of variation in response to a controlling voltage applied thereto, an oscillator having an output voltage of periodic sawtooth waveform, means applying said sawtooth output voltage to said network as a controlling voltage therefor, a phase detector for comparing the outputs of said source and of said network, means for applying the output of said detector to said oscillator as an external synchronizing signal therefor, and means for utilizing the output of said network.

4. In a frequency synthesizer, a stable frequency source of oscillatory energy, a variable time delay network coupled to the output of said source, the time delay provided by said network being capable of variation in response to a controlling voltage applied thereto, means for applying a non-sinusoidal repetitive wave of predetermined frequency as a controlling voltage to said network, to thereby produce a network output wave having a frequency which is different from the frequency of said source and the value of which depends upon the periodicity of said controlling voltage, and means for maintaining said stable frequency energy and said non-sinusoidal repetitive wave in a predetermined relationship.

5. In a frequency synthesizer, a stable frequency source of oscillatory energy, a variable time delay network coupled to the output of said source, the time delay provided by said network being capable of variation in response to a controlling wave applied thereto, an oscillator producing a continuous output wave having a predetermined periodicity, means applying said output wave as a controlling wave to said network, to thereby produce a network output wave having a frequency which is different from the frequency of said source and the value of which depends upon the periodicity of said controlling wave, means for maintaining said stable frequency energy and said continuous output wave in a predetermined relationship, and means for utilizing said network output wave.

6. In a frequency synthesizer, a stable frequency source of oscillatory energy, a variable time delay network coupled to the output of said source, the time delay provided by said network being capable of variation in response to a controlling wave applied thereto, a variable frequency oscillator producing a continuous output wave of sawtooth waveform having a predetermined periodicity, said oscillator being constructed and arranged to be operated either astably or synchronized to an external signal, means for maintaining said stable frequency energy and said output wave in a predetermined relationship, and means applying said output wave as a controlling wave to said network, to thereby produce a network output wave having a frequency which is different from the frequency of said source and the value of which depends upon the periodicity of said controlling wave.

References Cited in the file of this patent

UNITED STATES PATENTS

| | | |
|---|---|---|
| 2,065,565 | Crosby | Dec. 29, 1936 |
| 2,565,231 | Hepp | Aug. 21, 1951 |
| 2,581,199 | Moe | Jan. 1, 1952 |
| 2,650,350 | Heath | Aug. 25, 1953 |